United States Patent [19]
Sheikholeslami et al.

[11] Patent Number: 5,808,929
[45] Date of Patent: Sep. 15, 1998

[54] NONVOLATILE CONTENT ADDRESSABLE MEMORY

[76] Inventors: Ali Sheikholeslami, 52 Pharmacy Avenue, Scarborough, Canada, M1L 3E5; P. Glenn Gulak, 208 Clendenan Avenue, Toronto, Ontario, Canada, M6P 2X2; Takahiro Hanyu, 3-2-810, Moniwadai 4 Chome, Taihaku-Ku, Sendai 982-02, Japan

[21] Appl. No.: 761,039

[22] Filed: Dec. 5, 1996

Related U.S. Application Data

[60] Provisional application No. 60/008,571 Dec. 6, 1995.
[51] Int. Cl.$^6$ .................................................. G11C 15/00
[52] U.S. Cl. ............................................ 365/49; 365/145
[58] Field of Search .............................. 365/49, 145, 149, 365/117

[56] References Cited

U.S. PATENT DOCUMENTS

| 4,809,225 | 2/1989 | Dimmler et al. | 365/149 |
| 4,910,708 | 3/1990 | Eaton, Jr. et al. | 365/145 |
| 5,130,945 | 7/1992 | Hamamoto | 365/49 |
| 5,291,436 | 3/1994 | Kamisawa | 365/145 |
| 5,455,784 | 10/1995 | Yamada | 365/49 |
| 5,515,320 | 5/1996 | Miwa | 365/49 X |

FOREIGN PATENT DOCUMENTS

0293798 A2 7/1988 European Pat. Off. .

OTHER PUBLICATIONS

T. Hanyu et al. entitled "Functionally Separated, Multiple-Valued Content-addressable Memory and its Applications", IEEE Proc.–Circuits Devices Syst., vol. 142, No. 3, pp. 165–172, Jun. 1995.
K. Schultz et al. entitled "Architectures for Large-Capacity CAMs", INTEGRATION: the VLSI Journal, vol. 18, pp. 151–171, 1995.
J.P. Wade et al. entitled "A Ternary Content Addressable Search Engine", IEEE Journal of Solid–State Circuits, vol. 24, No. 4, Aug. 1989, pp. 1003–1013.
M. Hariyama et al, entitled "A Collision Detection Processor for Intelligent Vehicles", IEICE Trans. Electron, vol. E76–C, No. 12, pp. 1804–1811, Dec. 1993.
S. W. Wood, Ferroelectric Memory Design, University of Toronto, 1991, pp. 65–67.
A. Sheikholeslami et al. "A Multiple–Valued Ferroelectric Content–Addressable Memory", ISMVL Conference Proceesings, May 1996.

Primary Examiner—David C. Nelms
Assistant Examiner—Son Mai
Attorney, Agent, or Firm—Angela C. de Wilton

[57] ABSTRACT

Binary and multiple-valued nonvolatile content addressable memories (NVCAMs) use ferroelectric capacitors as nonvolatile storage elements. The operation of the NVCAMs is accessed either in serial or in parallel. In a 2-bit NVCAM of a parallel access structure, search operation is performed by a simultaneous access a 4-level polarization of the ferroelectric capacitor. The total number of search operations is reduced.

16 Claims, 8 Drawing Sheets

NONVOLATILE CONTENT ADDRESSABLE MEMORY

This application claims priority of a provisional application No. 60/008,571 filed Dec. 6, 1995.

TECHNICAL FIELD

The present invention relates to a nonvolatile content addressable memory (NVCAM), and in particular to a binary NVCAM and a multiple-valued NVCAM.

BACKGROUND ART

Content addressable memories (CAMs) are used in several applications ranging from look-up tables to artificial neural networks. One application of CAMs is an electronic spelling checker, where a CAM-based dictionary is searched to locate a word with a specific spelling. If there is at least one word with the same spelling as the input word, the search will be successful. A CAM searches for data by content rather than by address. Thus, a CAM is distinguished from a conventional address-based random access memory (RAM) which searches for data at a particular address. A typical CAM includes an array of core cells and comparators, so as to perform the dual functions of storage of a bit of data and comparison of the stored bit to applied reference data. Many CAMs are designed with dynamic circuits to achieve a higher density than that of static random access memory-based CAMs. Dynamic CAMs, however, need a stand-by power supply as well as periodic refreshing of their contents even during periods when the CAM is not being searched. An NVCAM using floating-gate metal oxide semiconductor (MOS) devices eliminates the stand-by-power-supply problem (see a paper by T. Hanyu et al. entitled "Functionally Separated, Multiple-Valued Content-addressable Memory and its Applications", IEEE Proc.-Circuits Devices Syst., Vol. 142, No. 3, pp. 165–172, June 1995). It does not, however, support real-time programming and hence, it may constrain the CAM-based application.

European Patent Application published on 7 Dec. 1988 (EP 0 293 798 A2) discloses nonvolatile memories using ferroelectric capacitors. U.S. Pat. No. 4,910,708 granted to S. S. Eaton, Jr. et al. on Mar. 20, 1990 discloses shadow RAMs. U.S. Pat. No. 4,809,225 granted to K. Dimmler et al. on Feb. 28, 1989 discloses transpolarizers. U.S. Pat. No. 5,291,436 granted to A. Kamisawa on Mar. 1, 1994 discloses ferroelectric memory cells with multiple-value states.

In this disclosure, an FCAM means a content addressable memory using a ferroelectric capacitor as a storage element and FRAM means a random access memory using a ferroelectric capacitor as a storage element.

DISCLOSURE OF THE INVENTION

It is an object of the present invention to provide a binary NVCAM and a multiple-valued NVCAM.

In accordance with one aspect of the present invention, there is provided a binary nonvolatile content addressable memory (NVCAM) comprising a j row by k column memory cell array connected to bit lines, drive lines and word lines, each cell including a ferroelectric capacitor for storing data by the bit line and the drive line when the word line is asserted, wherein j and k are integers.

According to the present invention, because the ferroelectric capacitors are used as storage elements, NVCAMs are provided. The NVCAM has an apparent advantage over the conventional dynamic CAM, because neither a stand-by power supply nor periodic refreshing of the contents of the CAM is required.

In accordance with another aspect of the present invention, there is provided a multiple-valued NVCAM comprising: a j row by k column memory cell array, the cells of each column being connected to m bit lines, each cell including m switching means and m ferroelectric capacitors, j, k and m being integers, one switching means and the respective ferroelectric capacitor being connected in series between the respective bit line and a drive line, the switching means being asserted by a signal on a respective word line; and data sensing means for comparing the data stored in the cells to reference data.

In an example, the data sensing means comprises data acquisition means for acquiring the comparison results and further comprises j data comparison means, each data comparison means being connected to the cells of the respective column and the data acquire means, each data comparison means comparing the data stored in the cells of the respective column to the reference data to provide comparison results to the data acquire means.

In accordance with another aspect of the present invention, there is provided a multiple-valued NVCAM comprising: a j row by k column memory cell array, the cells of each column being connected to a bit line, m drive lines and m word lines, each cell including m field effect transistors (FETs) and m ferroelectric capacitors, one FET and the respective ferroelectric capacitor being connected in series between the bit line and the respective drive line, the FET being turned on and off by a signal on the respective word line, j, k and m being integers, the capacitances of the m ferroelectric capacitors of one cell being different; and data sensing means for comparing the data stored in the cells to reference data.

According to the present invention, each cell includes k ferroelectric capacitors as data storage elements and it is provided with a k-bit NVCAM. In a case where k is two, a 2-bit NVCAM (i.e., 4 valued NVCAM) is provided. The operation of the NVCAMs is accessed either in serial or in parallel. In a 2-bit NVCAM of a parallel access structure, search operation is performed by a simultaneous access to a 4-level polarization of the ferroelectric capacitor. Data of two bits can be stored in a unified cell and retrieved simultaneously and hence, the speed/bit of match operation is increased.

BRIEF DESCRIPTION OF THE DRAWINGS

The present invention will be further understood from the following description with reference to the accompanying drawings, in which.

DETAILED DESCRIPTION

1. Content Addressable Memory (CAM)

Figure 1:
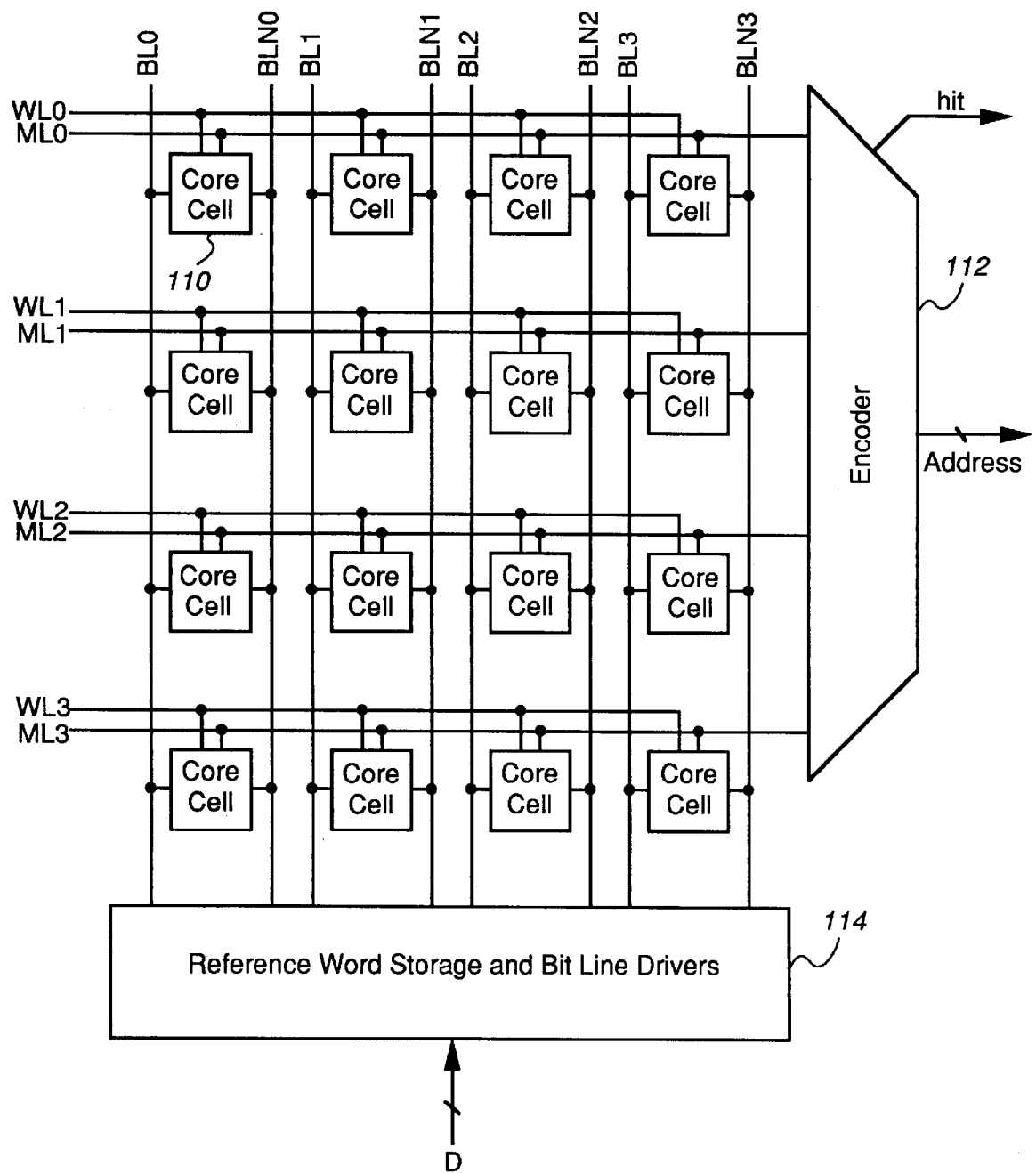
FIG. 1 is a block diagram of a conventional CAM.

FIG. 1 shows a conventional CAM (see a paper by K. J. Schultz et al. entitled "Architectures for Large-Capacity CAMs", INTEGRATION: the VLSI Journal, Vol. 18, pp. 151–171, 1995). The CAM includes a 4 row by 4 column core cell array. The four core cells 110 of each row are connected to a respective word line WL0, WL1, WL2 or WL3 and a respective match line ML0, ML1, ML2 or ML3. The four match lines are connected to an encoder 112. The four core cells 110 of each column are connected to a pair of bit lines BL0, BLN0; BL1, BLN1; BL2, BLN2; or BL3, BLN3. The bit lines for differential data are connected to reference word storage and bit line drivers 114 which receive input data D for loading the contents of the CAM and for the search reference word. Data stored in the array's core cells are searched by applying a reference word on the bit lines. The match lines are pulled low by any mismatched bit to which they are connected. In rows where the reference data matches the stored data exactly, the match line remains high. The encoder 112 selects a single row in the case of multiple matches, and provides a hit signal along with the binary address of the selected row. That row can then be accessed for subsequent reads and writes. The hit signal is a binary signal indicating whether a match was found.

Figure 2:
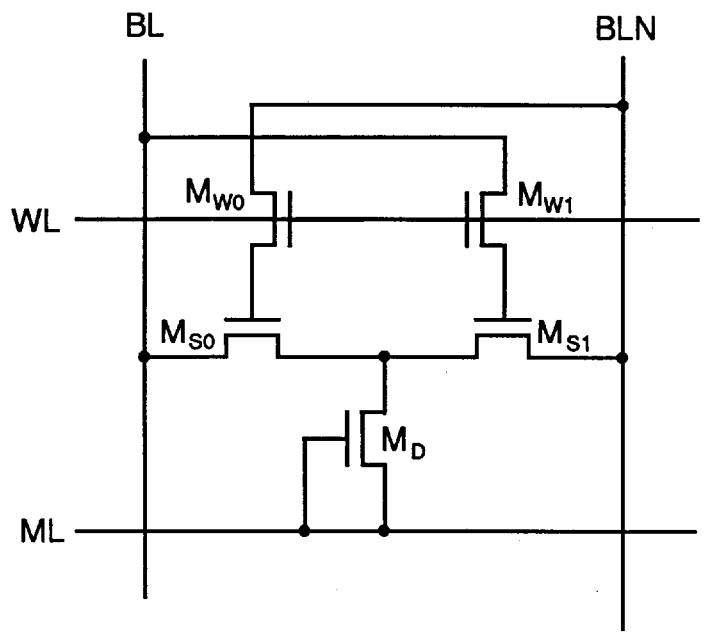
FIG. 2 is a circuit diagram of a conventional binary dynamic CAM cell.

FIG. 2 shows a conventional dynamic CAM cell (see a paper by J. P. Wade et al. entitled "A Ternary Content Addressable Search Engine", IEEE Journal of Solid-State Circuits, Vol. 24, No. 4, August 1989, pp. 1003–1013). Differential binary data to be stored in the CAM cell is presented on bit lines BL and BLN. When access transistors $M_{W0}$ and $M_{W1}$ are turned on by the write signal on a word line WL, the differential binary data is stored on the gates of two transistors $M_{S0}$ and $M_{S1}$ via the on transistors $M_{W0}$ and $M_{W1}$, respectively. If the word line WL is disabled, the digital state of a match line ML will be determined by the exclusive NOR gate of the stored data and the reference data. Therefore, a mismatch pulls down the match line ML to the ground level via a transistor $M_D$, while a match will leave the match line ML in its precharged high level. Due to substrate leakage, the stored data must be refreshed on a regular basis and hence, the CAM is volatile.

A plurality of cells can be laid out in a row with a common match line to implement a word. In a word-serial (bit parallel) architecture, the words are accessed sequentially and compared against a reference word. If there is a match, the precharged high match line remains high. Otherwise, it is pulled low. A full search operation in this scheme requires w cycles where w is the total number of words in the memory. Similarly, the cells of a word can be laid out in a column with a match register at the end of each word. In a bit-serial (word-parallel) architecture, a search operation begins with a simultaneous comparison of the most significant bit of each word with the most significant bit of the reference word, and continues with the comparisons of the less significant bits of each word with the corresponding bits of the reference word. After each simultaneous comparison, the match registers are updated to hold the most recent match information. A full search operation in this scheme requires n cycles where n is the number of bits per word. Since n is usually much smaller than w, a bit-serial architecture has the advantage of completing a search much faster than a word-serial architecture.

2. Ferroelectric Capacitor

A ferroelectric capacitor is physically distinguished from a regular capacitor by substituting the dielectric with a ferroelectric material. Two important characteristics of this material are its high permitivity and its bistability. Higher permitivity of the ferroelectric capacitor allows its integration in much smaller area than a regular capacitor. For example, the permitivity of PZT, a typical ferroelectric material, is at least one order of magnitude larger than the silicon dioxide employed in typical ASIC processes. As a result, the size of the ferroelectric capacitor usable in an integrated memory cell would be about the size of a source or drain contact, for example, 2 $\mu$m by 2 $\mu$m. In addition, the ferroelectric capacitors can be fabricated directly on top of the access transistors. The size of the memory cell is therefore constrained by the size of an access transistor.

Figure 3A:
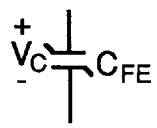
FIG. 3A illustrates a ferroelectric capacitor.
Figure 3B:
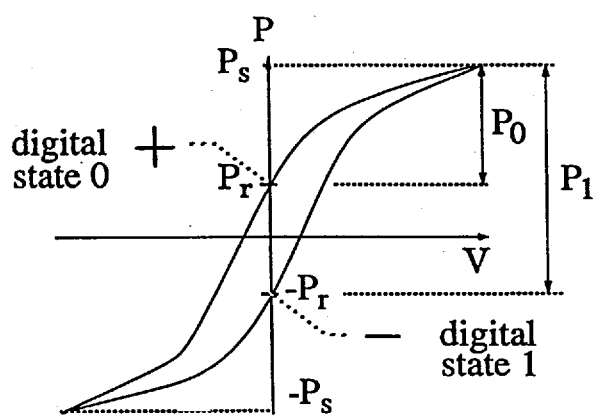
FIG. 3B illustrates a characteristic curve of the ferroelectric capacitor.

A ferroelectric capacitor is capable of storing one bit of data in the form of electric polarization (see European Patent Application (EP 0 293 798 A2)). The symbol of a ferroelectric capacitor having a capacitance $C_{FE}$ is shown in FIG. 3A and a voltage Vc is induced across the ferroelectric capacitor. FIG. 3B shows the hysterisis loop characteristic of the ferroelectric capacitor. When the voltage V across the ferroelectric capacitor is zero, the ferroelectric capacitor remains in either a negative polarization state (corresponding to a digital state "1") or a positive polarization state (corresponding to a digital state "0"). Assuming the ferroelectric capacitor is in state "1", a positive pulse will bring it to state "0", while a negative pulse will not affect its state. Similarly, a negative pulse can flip the state of the ferroelectric capacitor in which the initial state is "0".

A ferroelectric capacitor can be used to store binary data and hold the data without refreshing and stand-by power. Also, a data write into a ferroelectric capacitor takes the same amount of time as a data read, in contrast to other techniques. Embodiment structures exploit the above properties of ferroelectric capacitors to implement a nonvolatile binary CAM that supports real time programming. Moreover, two bits of data are combined in a unified cell and accessed simultaneously to produce a 4-level polarization. Using this technique, a new multiple-valued FCAM is proposed that combines a higher speed per bit with the advantages of a binary FCAM.

3. Ferroelectric CAM cell

Figure 4:
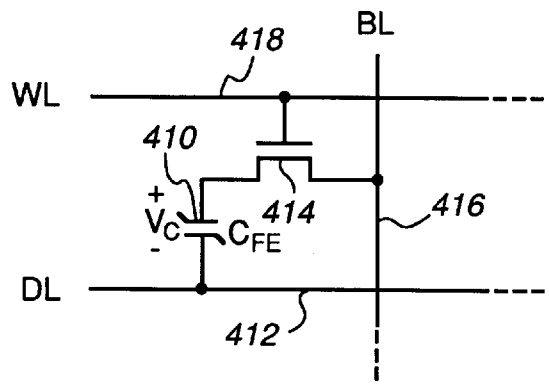
Figure 4 is a circuit diagram of a 1T–1F binary FRAM cell.

FIG. 4 shows an FRAM cell in which a ferroelectric capacitor constitutes the core of a memory cell. The FRAM cell shown in FIG. 4 is a single-ended binary memory cell in which one ferroelectric capacitor and one access transistor are used: i.e., "1T–1F memory cell". The 1T–1F memory cell is disclosed in European Patent Application (EP 0 293 798 A2). In FIG. 4, one electrode of a ferroelectric capacitor 410 is connected to a drive line (DL) 412 and the other electrode of the ferroelectric capacitor 410 is connected to the drain of an access NMOS transistor 414, the source of which is connected to a bit line (BL) 416. The gate of the transistor 414 is connected to a word line (WL) 418.

The cell is activated via the word line 418, and written or read through the bit line 416 and the drive line 412. In writing a binary digit "0" to the cell, a positive voltage (normally the full power supply $V_{dd}$) is applied to the bit line 416 while the drive line 412 is grounded and the word line 418 is asserted. In writing a binary digit "1", a positive voltage is applied to the drive line 412 while the bit line 416 is grounded and the word line 418 is asserted. Reading the stored data consists of a sequence of precharging the bit line 416, asserting the word line 418, pulsing the drive line 412, and sensing the voltage developed on the bit line 416 by a sense amplifier (not shown). Since the reading process is destructive, the sensed data must be written back to the memory cell. This will be automatically done after the data is latched in the sense amplifier by restoring the drive line 412 back to the ground level by peripheral circuitry (not shown).

4. Ferroelectric CAM (FCAM)

(i) 1T–1F FCAM

Figure 5:
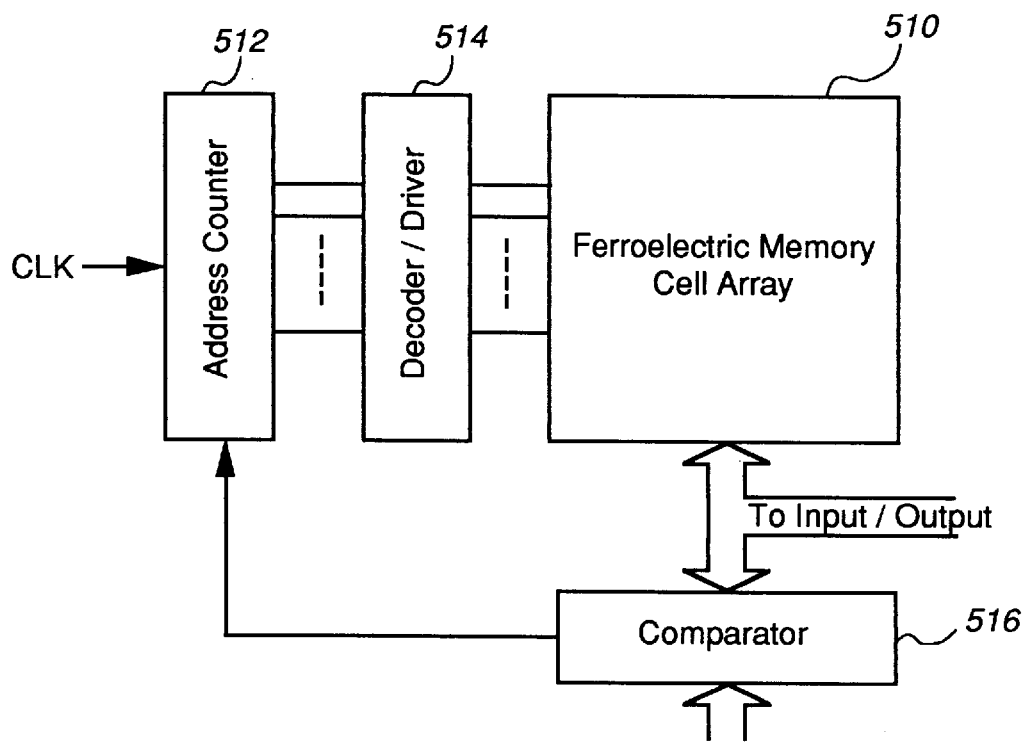
FIG. 5 is a block diagram of a nonvolatile CAM according to an embodiment of the present invention.

FIG. 5 shows a binary FCAM according to one embodiment of the present invention. In FIG. 5, an FCAM includes a ferroelectric memory cell array 510, an address counter 512, a decoder/driver 514 and a comparator 516. The address counter 512 provides the address of a word that must be compared with the reference word. The address is incremented (or decremented) whenever a mismatch occurs. When a match occurs, the address counter is stopped and its content is used for subsequent reads or writes. The diagram depicts both word-serial and bit-serial operations by properly orienting the ferroelectric memory cell array 510.

(ii) 2T–1F CAM

Figure 6:
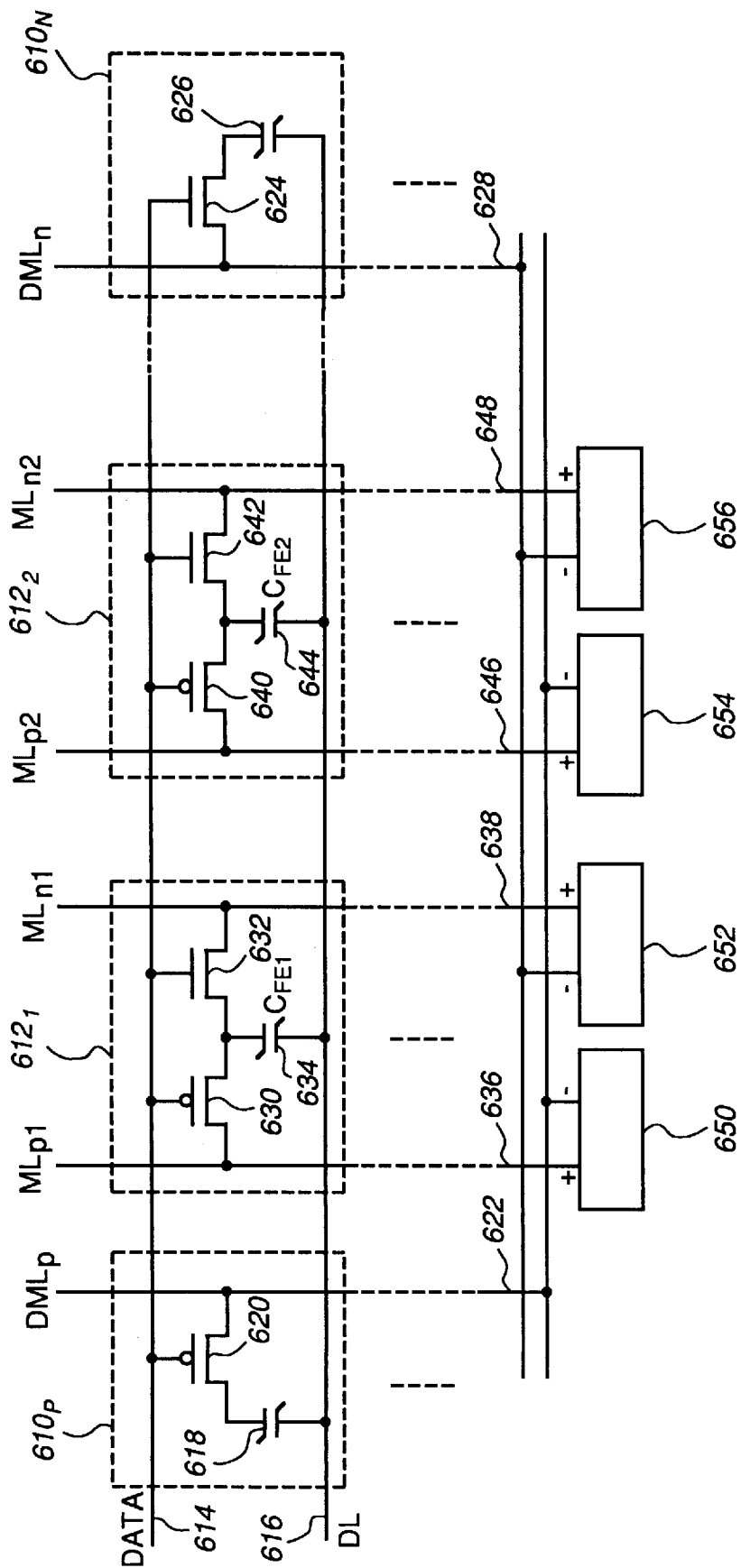
FIG. 6 is a circuit diagram of a complementary 2T–1F binary FCAM according to another embodiment of the present invention.

FIG. 6 shows a complementary binary FCAM according to another embodiment of the present invention. The FCAM includes a j row by k column ferroelectric cell array. Each cell includes a ferroelectric capacitor and PMOS and NMOS transistors. In comparing the complementary FCAM cell to the FRAM cell shown in FIG. 4, the PMOS transistor is added and word lines WL and bit lines BL of the FRAM are replaced by the data lines DATA and the match lines ML, respectively.

All PMOS transistors in the same column are connected to a P-match line, and all the NMOS transistors are connected to an N-match line. There exit also two dummy cells per row, which are connected to two dummy match lines $DML_p$ and $DML_n$. Binary data is written into an FCAM cell in a way similar to a write in an FRAM. A comparison between the stored data and the reference data is made by first writing a "1" and then a "0" into the dummy cells connected to the dummy match lines $DML_n$ and $DML_p$, respectively, then precharging the match lines, bringing the data line DATA to the logic value of the reference data, pulsing the drive line DL, and enabling sense amplifiers.

One row includes P- and N-type dummy cells $610_p$ and $610_N$ and k binary FCAM cells. In FIG. 6, only one row and two columns are shown. The dummy cells $610_p$ and $610_N$ and binary FCAM cells $612_1$ and $612_2$ of one row are connected to a respective data line (DATA) 614 and a respective drive line (DL) 616. The dummy cell $610_p$ includes a ferroelectric capacitor 618 which is connected between the drive line 616 and the source of an access PMOS transistor 620. The gate and the drain of the transistor 620 are connected to the data line 614 and a dummy match line ($DML_p$) 622, respectively. Similarly, the other dummy cell $610_N$ includes a ferroelectric capacitor 624 which is connected between the drive line 616 and the drain of an access NMOS transistor 626. The gate and the source of the transistor 626 are connected to the data line 614 and another dummy match line ($DML_n$) 628, respectively. The FCAM cell $612_1$ of the first column includes a PMOS transistor 630, an NMOS transistor 632 and a ferroelectric capacitor 634. One electrode of the ferroelectric capacitor 634 is connected to the drive line 616. The other electrode of the ferroelectric capacitor 634 is connected to the source of the transistor 630 and the drain of the transistor 632. The gate and the drain of the transistor 630 are connected to the data line 614 and a match line ($ML_{p1}$) 636, respectively. The gate and the source of the transistor 632 are connected to the data line 614 and a match line ($ML_{n1}$) 638, respectively. Similarly, the FCAM cell $612_2$ of the second column includes PMOS and NMOS transistors 640 and 642 and a ferroelectric capacitor 644. The one electrode of the ferroelectric capacitor 644 is connected to the drive line 616. The other electrode of the ferroelectric capacitor 644 is connected to the source of the transistor 640 and the drain of the transistor 642. The gates of the transistors 640 and 642 are connected to the data line 614. The drain of the transistor 640 and the source of the transistor 642 are connected to match lines 646 and 648, respectively. Two sense amplifiers are connected to the cells of one column via the respective match lines. The match lines 636 and 638 of the first column are connected to the non-inverting input terminals of two sense amplifiers 650 and 652, respectively. Similarly, the match lines 646 and 648 of the second column are connected to the non-inverting input terminals of two sense amplifiers 654 and 656, respectively. The dummy match line 622 is connected to the inverting input terminals of the sense amplifiers 650 and 654. The dummy match line 628 is connected to the inverting input terminals of the sense amplifiers 652 and 656.

The first row of the array (the top row) corresponds to the most-significant bits of the data and the last row ($j^{th}$) corresponds to the least-significant bits of the data. Each word is stored in the cells of one column with its most-significant bit on the top row and its less-significant bits on the consecutive rows. A bit-serial search operation begins with comparisons of the most-significant bits of the stored words (the first row) with the most significant bit of the reference word. If the most significant bit of the reference word is either greater or smaller than that of any particular stored word, a final conclusion can be made immediately about the reference word being greater or smaller than that particular stored word, respectively. However, for the words with their most significant bits equal to that of the reference word, the final conclusion is postponed to the next cycle when the comparison is made between the second most significant bit of the reference word and those of the stored words. This process continues until the last cycle when the least significant bits are compared. At this point the relation between each word and the reference word is known. The peripheral circuitry that leads to the final conclusion is not shown in FIG. 6.

The precharging levels for the match lines $ML_n$ and $ML_p$ are different from that of the dummy match lines $DML_n$ and $DML_p$, respectively. The match lines $ML_n$ and $ML_p$ are precharged to $(V_{dd}/2+\Delta V)$ and $(V_{dd}/2-\Delta V)$, respectively, whereas the dummy match lines $DML_n$ and $DML_p$ are both precharged to $V_{dd}/2$. For a step sensing scheme in which a step voltage is applied to the drive line DL and maintained until the sense amplifiers are latched, $\Delta V$ is chosen to be:

$$\Delta V = (\Delta V_1 - \Delta V_0)/2$$

where $\Delta V_0$ and $\Delta V_1$ are the voltage increments on the match line when the stored data is a "0" and a "1", respectively. The step sensing scheme is described in a master's thesis by S. W. Wood, "Ferroelectric Memory Design, University of Toronto, 1992, pp. 65–67.

If the reference data is a "1", the voltage on the match line $ML_n$ will increase by either $\Delta V_1$ or $\Delta V_0$, depending on the stored data, while the match line $ML_p$ remains unchanged. Upon enabling the sense amplifier, the match line $ML_n$ will latch to "1", for the stored data "1", or to a "0" for the stored data "0", while the match line $ML_p$ will latch to a "0". These results are summarized in Table I along with similar results for the case where the reference data is a "0". The last column of Table I shows how a decision can be made by knowing the logic levels of the match lines $ML_p$ and $ML_n$.

TABLE I

| Ref. Data | Stored Data | ($ML_{p1}$, $Ml_{n1}$) | Conclusion |
|---|---|---|---|
| 0 | 0 | (0, 1) | Ref. Data = Sto. Data |
| 0 | 1 | (1, 1) | Ref. Data < Sto. Data |
| 1 | 0 | (0, 0) | Ref. Data > Sto. Data |
| 1 | 1 | (0, 1) | Ref. Data = Sto. Data |

An exclusive OR gate (not shown) of the final logic values of the match lines $ML_n$ and $ML_p$ provides the equality signal, an AND gate provides the result of a Less-Than (LT) search, and a NOR gate provides the result of a Greater-Than (GT) search. The LT and GT searches prove useful in some applications (see a paper by M. Hariyama et al. entitled "A Collision Detection Processor for Intelligent Vehicles", IEICE Trans. Electron, Vol. E76-C, No. 12, pp. 1804–1811, December 1993). A GT search for an n-bit word can be accomplished in a bit-serial approach using n sequential steps.

The FCAM cell shown in FIG. 6 has several advantages over a conventional binary CAM cell. First, it is nonvolatile, as the ferroelectric capacitor can hold its stored data without an applied voltage. Second, it uses a single power supply for both writing into a cell and relational search. Third, the occupied area of the cell is smaller than that of the conventional dynamic cell, because the ferroelectric capacitor is normally mounted on top of the two access transistors.

In the FCAM shown in FIG. 6, if the number of cells per row is increased beyond a certain limit and hence increasing the parasitic capacitance on the drive line DL, a data comparison in one row can affect the stored data in other rows. This is because one of the two access transistors in each cell is always "on" to connect its corresponding ferroelectric capacitor to a match line. The ferroelectric capacitor is in series with the parasitic capacitance on the drive line DL, providing a capacitor divider that divides the voltage on the match line in favour of the ferroelectric capacitor if the drive line DL capacitor is large enough.

Figure 7:
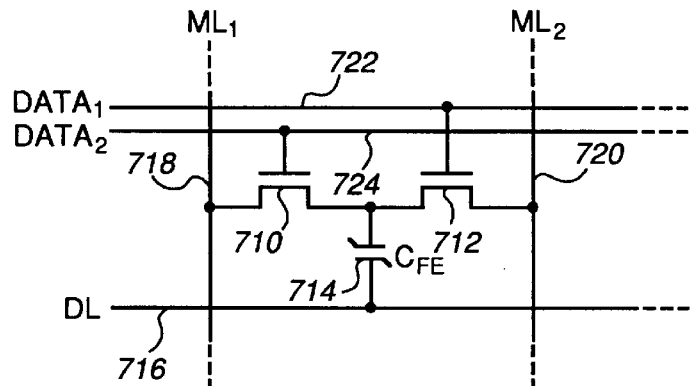
FIG. 7 is a circuit diagram of a 2T–1F binary FCAM cell.

In FIG. 7, a binary FCAM cell includes two NMOS transistors 710 and 712 and a ferroelectric capacitor 714. The ferroelectric capacitor 714 is connected between a drive line 716 and the drains of the transistors 710 and 712, the sources of which are connected to two match lines ($ML_1$, $ML_2$) 718 and 720, respectively. The gates of the transistors 712 and 710 are connected to different data lines ($DATA_1$ and $DATA_2$) 722 and 724, respectively. In comparing the cell shown in FIG. 7 to the cell shown in FIG. 6, the PMOS transistor is replaced with an NMOS transistor, and the two access transistors are controlled by different data on the lines 722 and 724. The dummy cells using PMOS transistors as shown in FIG. 6 are also replaced by dummy cells using NMOS transistors and controlled by the data line 724. Because the peripheral circuitry for the circuit shown in FIG. 7 is identical to that of FIG. 6, it is not shown. When an access is made to a specific row of the cell array, both data lines 722 and 724 of all other rows can be set "low" and, therefore, disconnecting the unaccessed ferroelectric capacitors from the match lines 718, 720. This cell also has an area advantage due to using NMOS transistors only. The comparison results are summarized in Table II. The data on the data lines 722 and 724 may be differential.

TABLE II

| Ref. Data | Stored Data | ($ML_1$, $ML_2$) | Conclusion |
|---|---|---|---|
| 0 | 0 | (0, 1) | Ref. Data = Sto. Data |
| 0 | 1 | (1, 1) | Ref. Data < Sto. Data |
| 1 | 0 | (0, 0) | Ref. Data > Sto. Data |
| 1 | 1 | (0, 1) | Ref. Data = Sto. Data |

5. Multiple-Valued CAM Cell

Figure 8A:
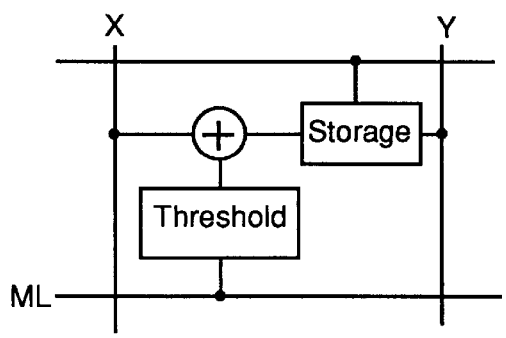
FIG. 8A is a block diagram of a conventional multiple-valued CAM cell.
Figure 8B:
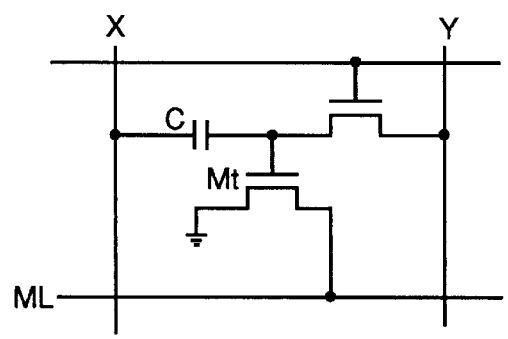
FIG. 8B is a circuit diagram of a conventional multiple-valued CAM cell.

Multibit CAMs using capacitors are known. For example, a paper by T. Hanyu et al. entitled "Functionally Separated, Multiple-Valued Content-addressable Memory and its Applications", IEEE Proc.-Circuits Devices Syst., Vol. 142, No. 3, pp. 165–172, June 1995, describes a multiple-valued CAM (MVCAM) cell in which multiple-valued data search is made. Each search consists of two logic value conversions and a threshold operation. The paper describes a 2T–1C multiple-valued CAM cell for one digit, as shown in FIG. 8A. A capacitor in the cell is used for both storing multiple-valued data and summing up the stored data with input data. A transistor is used to perform the threshold operation. FIG. 8B shows a circuit diagram of the 2T–1C multiple-valued CAM cell. A capacitor C is used for both storing the multiple-valued data and summing up the stored data with the multiple-valued single-digit input data. An NMOS transistor Mt performs the threshold operation by pulling a match line ML down if the sum is greater than its threshold and leaving it unchanged if the sum is equal to or less than the threshold.

The capacitor is replaced by a ferroelectric capacitor to provide a nonvolatile MVCAM. A single ferroelectric capacitor as a storage element, however, faces some difficulties, as the present ferroelectric materials and technologies do not support a reliable storage of multilevel polarizations. However, it is possible to store multibit information using more than one ferroelectric capacitor in each cell.

Figure 9:
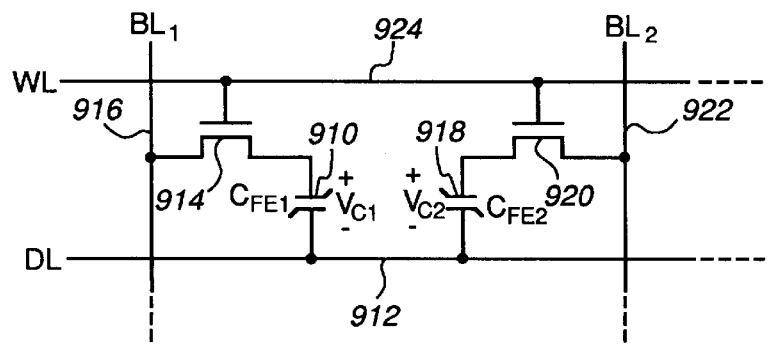
FIG. 9 is a circuit diagram of a 2-bit binary FRAM cell.

FIG. 9 shows one example of a cell in which two ferroelectric capacitors are used to store 2 bits of information. In FIG. 9, a ferroelectric capacitor 910 is connected between a drive line (DL) 912 and the drain of an NMOS transistor 914, the source of which is connected to a bit line ($BL_1$) 916. The binary data "0" and "1" on the bit line 916 correspond to 0 volts and $V_{dd}/2$ (e.g., 2.5 volts), respectively. Similarly, a ferroelectric capacitor 918 is connected between the drive line 912 and the drain of an NMOS transistor 920, the source of which is connected to a bit line ($BL_2$) 922. The binary data "0" and "1" on the bit line 922 correspond to 0 volts and $V_{dd}$ (e.g., 5.0 volts), respectively. The capacitances of the ferroelectric capacitors 910 and 918 are $C_{FE1}$, and $C_{FE2}$, respectively. The area of one ferroelectric capacitor 918 is twice the area of the other ferroelectric capacitor 910. The capacitance $C_{FE1}$ is smaller than the capacitance $C_{FE2}$. The gates of the transistors 914 and 920 are connected to a word line (WL) 924. In the cell, four voltage levels can be distinguished if the word line 924 and the drive line 912 are asserted and the bit lines 916 and 922 are shorted together by a switch (not shown). The lowest voltage level is sensed on the shared bit lines when both ferroelectric capacitors 910 and 918 are holding a digital state "0". The highest voltage level is sensed on the shared bit lines when both ferroelectric capacitors 910 and 918 are holding a digital state "1". The second lowest voltage level corresponds to a "1" on the ferroelectric capacitor 910 and a "0" on the ferroelectric capacitor 918, and the second highest voltage level corresponds to a "0" on the ferroelectric capacitor 910 and a "1" on the ferroelectric capacitor 918.

6. Multiple-Valued CAM (i) Parallel-access structure multiple-valued FCAM

Figure 10A:
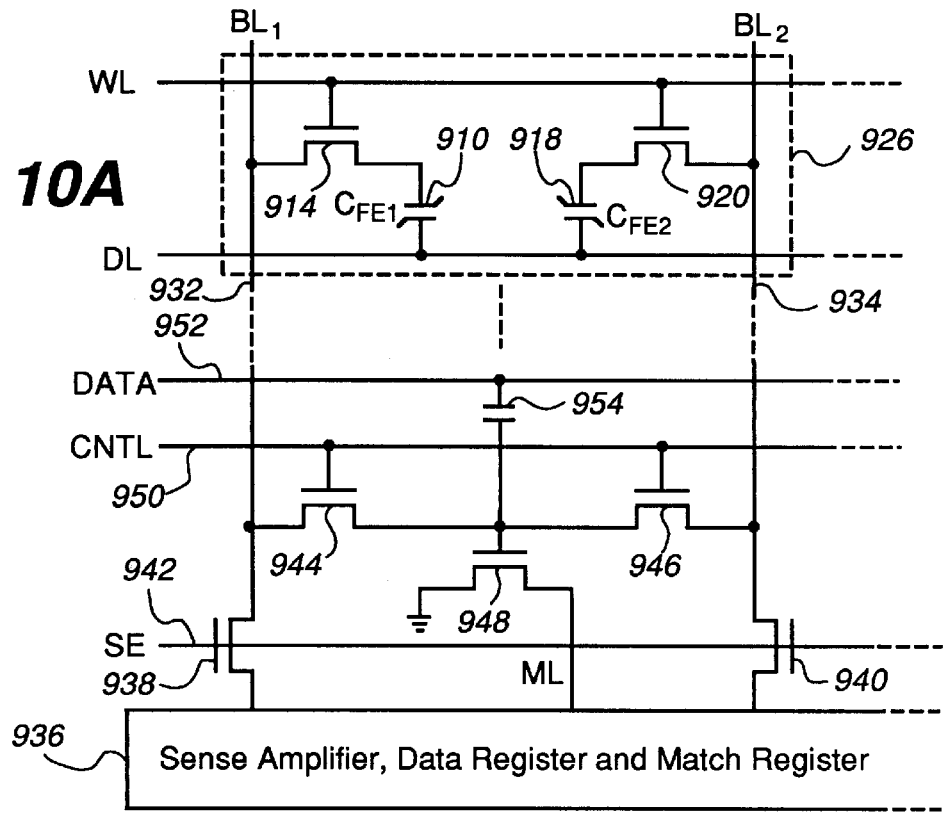
FIG. 10A is a circuit diagram of a parallel-access structure multiple-valued FCAM according to another embodiment of the present invention.

FIG. 10A shows part of an MVCAM including a j row by k column cell array. In FIG. 10A, each cell 926 is identical to the cell shown in FIG. 9. The gates of the transistors 914 and 920 are connected to a word line 928 of the respective row. The ferroelectric capacitors 910 and 918 are connected to a drive line 930 of the respective row. The sources of the transistors 914 and 920 are connected to a pair of bit lines ($BL_1$) 932 and ($BL_2$) 934 of the respective column. The bit lines 932 and 934 of one column are not differential bit lines and they carry data "1" of different voltages. The MVCAM includes a data acquisition circuit 936 having sense amplifiers, data registers and match registers. Also, the MVCAM includes data comparison circuitry having a data store capacitor and sense transistors in each column. The bit lines 932 and 934 are connected to the drains of NMOS transistors 938 and 940, respectively, the sources of which are connected to the data acquisition circuit 936. The gates of the transistors 938 and 940 are connected to a sense line (SE) 942. The bit lines 932 and 934 are connected to the drains of NMOS transistors 944 and 946, respectively, the sources of which are connected to the gate of an NMOS transistor 948. The drain of the transistor 948 is connected to the data acquisition circuit 936 through a match line ML. The gates of the transistors 944 and 946 are connected to a control line (CNTL) 950. A data line (DATA) 952 is connected to the sources of the transistors 944 and 946 through a capacitor 954. A comparison data signal having four levels of voltage is carried by the data line 952.

Using the multiple-valued FCAM shown in FIG. 10A, a bit-serial search operation is completed in half the number of cycles required in a binary CAM. Multiple-valued data is stored in the form of multibit data in a multibit FRAM cell. A 2-bit FRAM cell (a unified cell) is employed in FIG. 10A to store two bits of information. Also, there is a 2-bit register per column that allows a momentary storage of the sensed data during the threshold operation. Any relational search operation, such as the GT, LT, or equality search, can be performed by a combination of two multiple-valued threshold operations (see a paper by T. Hanyu et al. entitled "Functionally Separated, Multiple-Valued Content-addressable Memory and its Applications", IEEE Proc.-Circuits Devices Syst., Vol. 142, No. 3, pp. 165–172, June 1995).

Figure 10B:
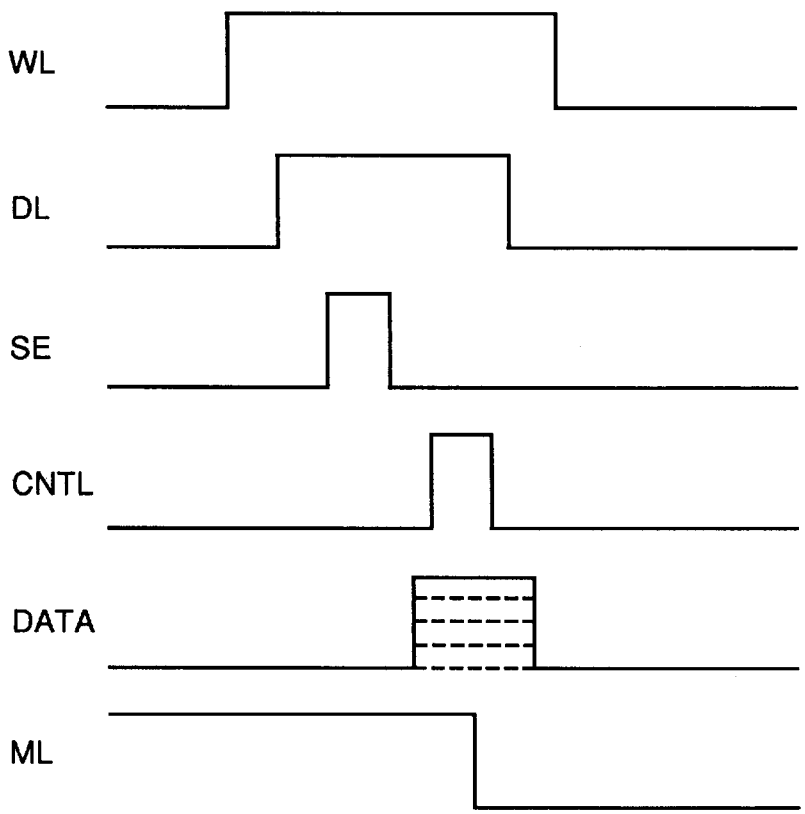
FIG. 10B is a timing chart showing the operation of the multiple-valued FCAM shown in FIG. 10A.

FIG. 10B shows a timing chart of operation of the circuit shown in FIG. 10A. Referring to FIGS. 10A and 10B, a threshold operation begins with a simultaneous read of the 2-bit stored data by pulsing the word line 928 and the drive line 930. The read operation includes an automatic write-back, as mentioned earlier, as well as a momentary write into the 2-bit register of the data acquisition circuit 936. As a result, the ferroelectric capacitor 910 sends its data to the bit line 932 while, simultaneously, the ferroelectric capacitor 918 sends its data to the bit line 934. This will cause a voltage increment on the bit line 932 and the bit line 934 that can take any of the four possible levels depending on the stored data. By pulsing the control signal CNTL, the multilevel voltage will appear on the gate of the transistor 948. The multilevel reference data (or its converted version) is then added to the gate of the transistor 948 via the coupling capacitor 954. This sum will turn the transistor 948 on or off depending on whether the sum is greater or less than the transistor threshold. The threshold operation is completed by writing back the contents of the 2-bit register to the 2-bit FRAM cell. The circuit may be used as binary FRAM, as well.

(ii) Serial-access structure multiple-valued FCAM

Figure 11A:
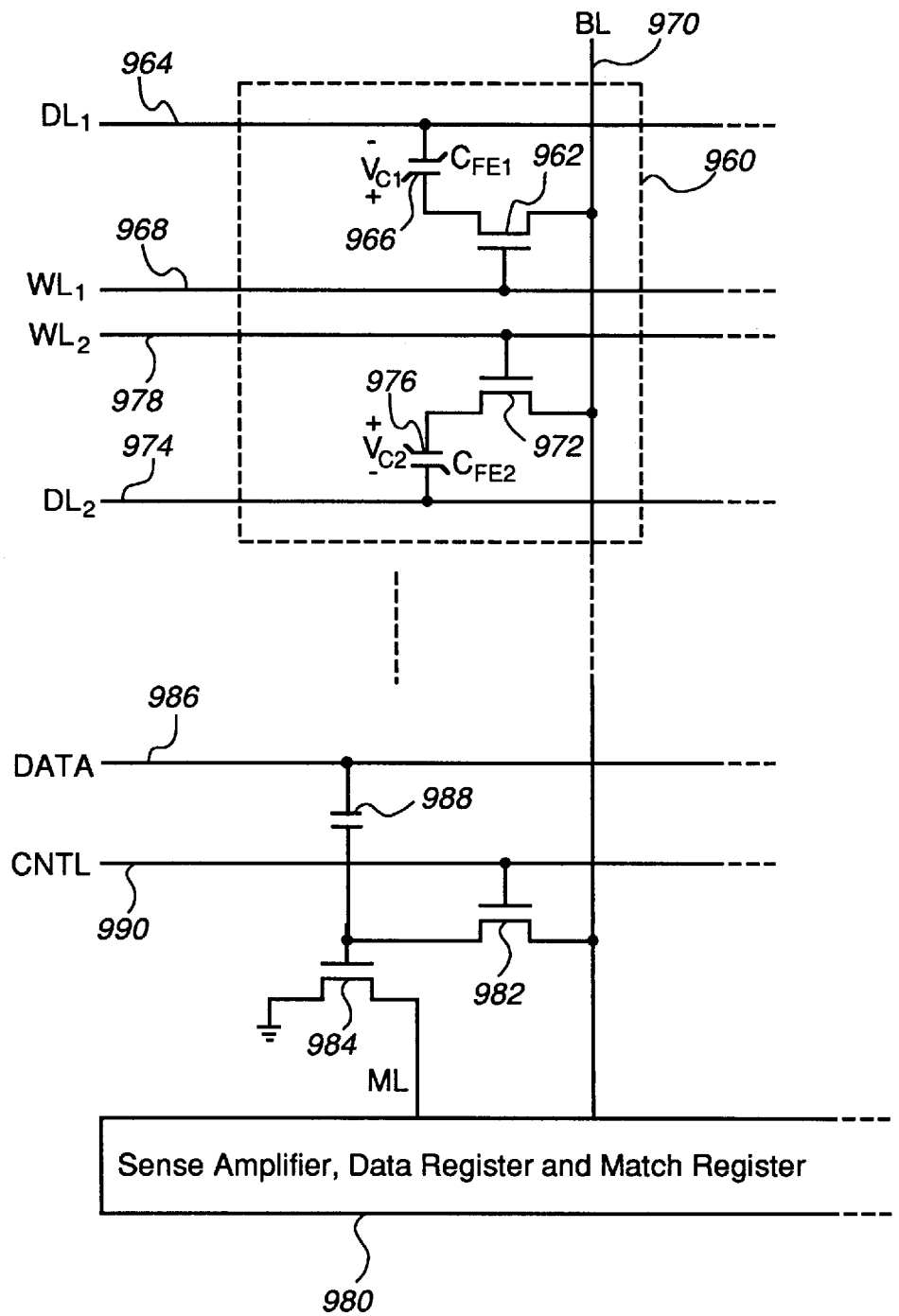
FIG. 11A is a circuit diagram of a serial-access structure multiple-valued FCAM according to another embodiment of the present invention.

FIG. 11A shows part of another MVCAM including a j row by k column cell array. Each cell includes two ferroelectric capacitors and two NMOS transistors. In a cell 960, the drain of an NMOS transistor 962 is connected to a first drive line ($DL_1$) 964 through a ferroelectric capacitor 966. The gate and the source of the transistor 962 are connected to a first word line ($WL_1$) 968 and to a bit line (BL) 970, respectively. The drain of another NMOS transistor 972 is connected to a second drive line ($DL_2$) 974 through another ferroelectric capacitor 976. The gate and the source of the transistor 972 are connected to a second word line ($WL_2$) 978 and to the bit line 970, respectively. The MVCAM includes a data acquisition circuit 980 having sense amplifiers, data registers and match registers. Also, the MVCAM includes data comparison circuitry having a data store capacitor and a sense transistor in each column. The bit line 970 is connected to the drain of an NMOS transistor 982, the source of which is connected to the drain of another NMOS transistor 984 and to a data line (DATA) 986 through a capacitor 988. The data line 986 carries a comparison data signal having four levels of voltage. The gate of the transistor 982 is connected to a control line (CNTL) 990. The drain and the source of the transistor 984 are connected to the data acquisition circuit 980 through a match line ML and the ground terminal, respectively.

Figure 11B:
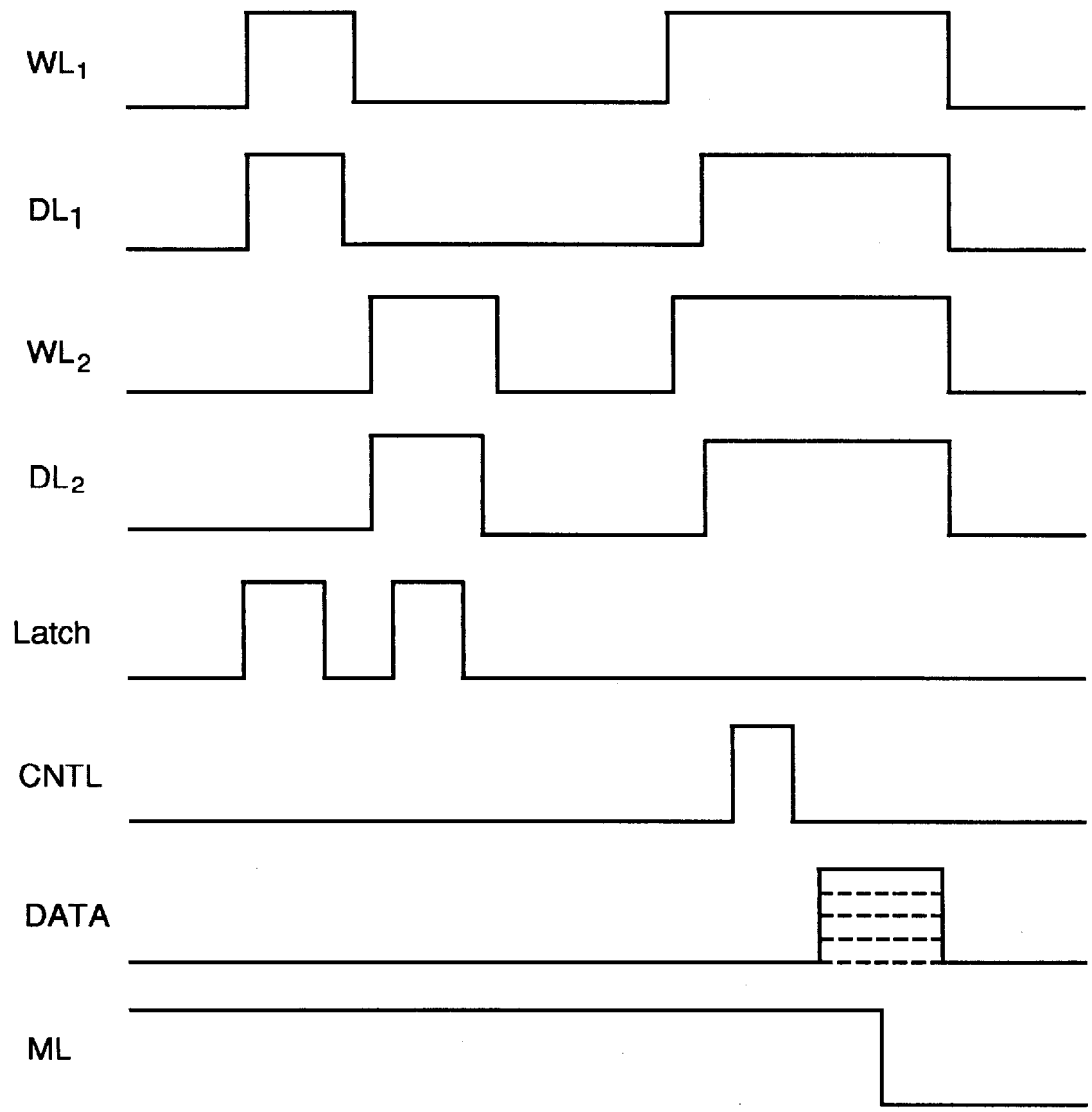
FIG. 11B is a timing chart showing the operation of the multiple-valued FCAM shown in FIG. 11A.

FIG. 11B shows a timing chart of operation of the circuit shown in FIG. 11A. Referring to FIGS. 11A and 11B, firstly, 1-bit data is stored in the ferroelectric capacitor 966 by asserting the transistor 962 and driving the first drive line 964. Thereafter, another 1-bit data is stored in the ferroelectric capacitor 976 by asserting the transistor 972 and driving the second drive line 974. As a result, the 2-bit data is stored in the unified cell 960 (i.e., data latching). A threshold operation begins with a simultaneous read of the 2-bit stored data by pulsing the word lines 968 and 978 and the drive lines 964 and 974. The read operation includes an automatic write-back and a momentary write into the 2-bit register of the data acquisition circuit 980. As a result, the ferroelectric capacitors 966 and 976 send their data to the bit line 970. It can take any of the four possible levels depending on the stored data. By pulsing the control signal CNTL, the multilevel voltage will appear on the gate of the transistor 984. The multilevel reference data is then added to the gate of the transistor 984 via the coupling capacitor 988. This sum will turn the transistor 984 on or off depending on whether the sum is greater or less than the transistor threshold. The threshold operation is completed by writing back the contents of the 2-bit register to the 2-bit FRAM cell (not shown).

Although particular embodiment of the present invention have been described in detail, it should be appreciated that numerous variations, modifications, and adaptations may be made without departing from the scope of the present invention as defined in the claims.

What is claimed is:

1. A binary nonvolatile content addressable memory (NVCAM) comprising a j row by k column memory cell array connected to bit lines, drive lines and word lines, each cell including a ferroelectric capacitor for storing data when the word line is asserted, wherein j and k are integers, the cell comprising two field effect transistors (FETs), the gates of the FETs being connected to the word line, the other two electrodes of the FETs being connected in series between a pair of differential bit lines, the junction of the FETs being connected to one electrode of the ferroelectric capacitor, the other electrode of which is connected to the drive line to which a drive signal is fed.

2. The binary NVCAM of claim 1, wherein the data access is of a word-serial basis, so that the data of a word is stored in the cells of each row.

3. The binary NVCAM of claim 1, wherein the data access is of a bit-serial basis, so that the bits of the data are stored in the cells of each column.

4. The binary NVCAM of claim 1, wherein the FETs are metal oxide semiconductor (MOS) transistors.

5. The binary NVCAM of claim 4, wherein the two MOS transistors of each cell have the same type channel.

6. The binary NVCAM of claim 4, wherein the two MOS transistors of each have different type channels.

7. The binary NVCAM of claim 1, wherein the two FETs are PMOS and NMOS transistors, the cell array comprising a pair of N- and P-type dummy cells per row, the P-type dummy cell including a PMOS transistor and a ferroelectric capacitor, the N-type dummy cell including an NMOS transistor and a ferroelectric capacitor.

8. The binary NVCAM of claim 7, wherein the PMOS and NMOS transistors of one cell are turned on and off alternately by a single signal.

9. The binary NVCAM of claim 1, wherein the two FETs are NMOS transistors, the cell array comprising a pair of N-type dummy cells per row, each dummy cell including an NMOS transistor and a ferroelectric capacitor.

10. The binary NVCAM of claim 9, wherein the two NMOS transistors of one cell are turned on and off by first and second signals.

11. The binary NVCAM of claim 10, wherein the first and second signals are differential signals.

12. The binary NVCAM of claim 7 or 9, further comprising comparison means for comparing the data stored in the cells to reference data.

13. The binary NVCAM of claim 12, wherein the comparison means including k pairs of first and second data comparison means, each pair is connected to cells of the respective column, the data stored in the cell being compared to the reference data through one of the MOS transistors or the other MOS transistor of the cell by the first or the second data sensing means of each pair.

14. The binary NVCAM of claim 13, wherein the data sensing means determines whether or not the stored data is greater than the reference data.

15. The binary NVCAM of claim 13, wherein the data sensing means determines whether or not the stored data is smaller than the reference data.

16. The binary NVCAM of claim 13, wherein the data sensing means determines whether or not the stored data is equal to the reference data.

* * * * *